United States Patent
Ban et al.

(10) Patent No.: US 7,646,071 B2
(45) Date of Patent: Jan. 12, 2010

(54) ASYMMETRIC CHANNEL DOPING FOR IMPROVED MEMORY OPERATION FOR FLOATING BODY CELL (FBC) MEMORY

(75) Inventors: Ibrahim Ban, Beaverton, OR (US); Avci E. Uygar, Beaverton, OR (US); David L. Kencke, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 251 days.

(21) Appl. No.: 11/444,941

(22) Filed: May 31, 2006

(65) Prior Publication Data
US 2007/0278572 A1 Dec. 6, 2007

(51) Int. Cl.
*H01L 29/76* (2006.01)
(52) U.S. Cl. .................. 257/404; 257/345; 257/347; 257/341; 257/335; 257/E29.053
(58) Field of Classification Search .................. 257/347, 257/404, 341, 335, 345, E29.053
See application file for complete search history.

(56) References Cited

U.S. PATENT DOCUMENTS

| | | | | |
|---|---|---|---|---|
| 5,446,299 A | * | 8/1995 | Acovic et al. | 257/316 |
| 5,461,250 A | * | 10/1995 | Burghartz et al. | 257/347 |
| 6,064,589 A | * | 5/2000 | Walker | 365/149 |
| 6,188,111 B1 | * | 2/2001 | Kumagai | 257/369 |
| 6,320,222 B1 | * | 11/2001 | Forbes et al. | 257/331 |
| 6,396,108 B1 | * | 5/2002 | Krivokapic et al. | 257/365 |
| 6,538,916 B2 | * | 3/2003 | Ohsawa | 365/149 |
| 6,686,630 B2 | * | 2/2004 | Hanafi et al. | 257/366 |
| 7,180,135 B1 | * | 2/2007 | Ioannou et al. | 257/347 |
| 7,198,990 B2 | * | 4/2007 | Joshi et al. | 438/142 |
| 7,202,517 B2 | * | 4/2007 | Dixit et al. | 257/287 |
| 7,256,458 B2 | * | 8/2007 | Nowak | 257/347 |
| 2007/0120200 A1 | * | 5/2007 | Yun | 257/401 |

* cited by examiner

*Primary Examiner*—Eugene Lee
(74) *Attorney, Agent, or Firm*—Blakely, Sokoloff, Taylor & Zafman LLP

(57) ABSTRACT

An improved dynamic memory cell using a semiconductor fin or body is described. Asymmetrical doping is used in the channel region, with more dopant under the back gate to improve retention without significantly increasing read voltage.

17 Claims, 4 Drawing Sheets

ASYMMETRIC CHANNEL DOPING FOR IMPROVED MEMORY OPERATION FOR FLOATING BODY CELL (FBC) MEMORY

FIELD OF THE INVENTION

This invention relates to the field of dynamic, random-access memories (DRAMs), and devices with double gates, particularly those using transistors with floating bodies.

PRIOR ART AND RELATED ART

Most common DRAM cells store charge on a capacitor and use a single transistor for accessing the capacitor. More recently, a cell has been proposed which stores charge in a floating body of a transistor. A back gate is biased to retain charge in the floating body.

In one proposal, an oxide layer is formed on a silicon substrate and a silicon layer for the active devices is formed on the oxide layer (SOI substrate). The silicon substrate is used as the back gate, and consequently, must be biased relative to the silicon layer. Unfortunately, the oxide layer is relatively thick, requiring a relatively high voltage (e.g., 100 volts) for the bias.

Several structures have been proposed to reduce this relatively high bias potential, including use of a double gate floating body and silicon pillars. These structures are difficult to fabricate. This and other related technology is described at C. Kuo, *IEDM*, December 2002, following *M. Chan Electron Device Letters*, January 1994; C. Kuo, *IEDM*, December 2002, "A Hypothetical Construction of the Double Gate Floating Body Cell;" T. Ohsawa, et al., *IEEE Journal of Solid-State Circuits*, Vol. 37, No. 11, Nov. 2002; and David M. Fried, et al., "*Improved Independent Gate N-Type FinFET Fabrication and Characterization,*" *IEEE Electron Device Letters*, Vol. 24, No. 9, Sept. 2003; *Highly Scalable FBC with 25 nm BOX Structure for Embedded DRAM Applications*, T. Shino, *IDEM* 2004, pgs 265-268; T. Shino, *IEDM* 2004, "*Fully-Depleted FBC (Floating Body Cell) with enlarged signal Window and excellent Logic Process Compatibility*;" T. Tanaka, *IEDM* 2004, "*Scalability Study on a Capacitorless 1T-DRAM: From Single-gate PD-SOI to Double-gate FinD-RAM*; U.S. Patent Application 2005/0224878; and "Independently Controlled, Double Gate Nanowire Memory Cell with Self-Aligned Contacts," U.S. patent application Ser. No. 11/321,147, filed Dec. 28, 2005.

DETAILED DESCRIPTION

In the following description, a memory and method for fabricating the memory is described. Numerous specific details are set forth, such as specific doping levels, to provide a thorough understanding of the present invention. It will be apparent to one skilled in the art, that the present invention may be practiced without these specific details. In other instances, well known processing steps and circuits have not been described in detail, in order not to unnecessarily obscure the present invention.

Figure 1:
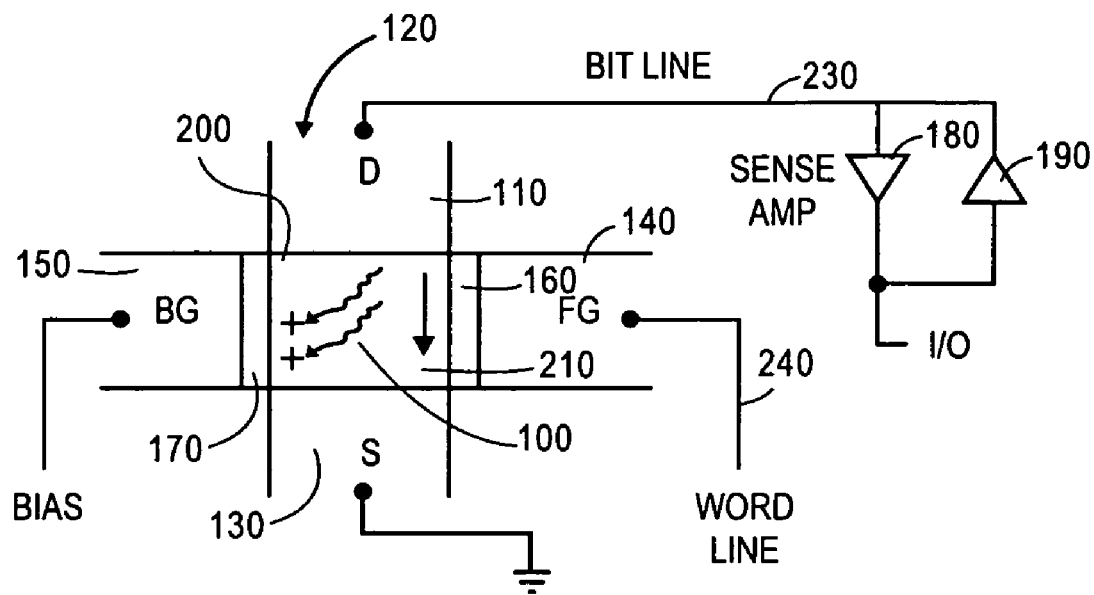
FIG. 1 is a plan view of a memory cell and its connection to the peripheral circuits in the memory.

A single memory cell is shown in schematic form in FIG. 1. A portion of a semiconductor line, body or fin 120, formed on an oxide layer (such as BOX 250 of FIG. 2), and etched from, for example, a monocrystalline silicon layer is illustrated. The body 120 includes a pair of spaced-apart, doped regions 110 and 130, disposed at opposite ends of the body thereby defining a channel region 100. In one embodiment, the channel region is a p type region, and the source region 130 and drain region 110 are more heavily doped with an n type dopant. As will be seen, the channel region is doped to two different doping levels adjacent to its opposite sides.

A pair of gates identified as a front gate 140 and back gate 150 are formed about the body 120, as will be discussed. The gates 140 and 150 are insulated from the channel region 100 of the silicon body 120 by the oxide layers or high k dielectric layers 160 and 170, respectively. In FIG. 1 the gates are shown on opposite sides of the body to simplify the figure. A more accurate depiction of the cell is shown in perspective view in FIG. 6. The fabrication of the cell of FIG. 1 is described in FIGS. 2-7 below. The cell is typically formed in an array of cells in a memory.

The memory cell of FIG. 1 is a four-terminal device, coupled to the peripheral circuits of the memory. For the n-channel embodiment illustrated, the source region is coupled to ground, and the back gate 150 is coupled to a source of bias (a constant potential), for example, −1 volt. The drain terminal 110 is connected to a bit line 230 in the memory. The front gate 140 is connected to a word line 240 in the memory, to allow selection of the cell. The cell, as will be described, is a dynamic, random access memory cell, and as such, the data stored requires periodic refreshing.

Assume first, that the cell of FIG. 1 is not storing charge, and that the cell is selected by the application of a positive potential to a word line which is coupled to the gate 140. Assume further, that a binary one is to be stored in (written into) the cell as represented by the storage of charge. (A binary 0 is represented by the absence of charge.) An amplifier 190 provides a positive potential to the bit line 230 causing conduction in the inversion channel 210 of the channel 100 of the body 120, as typically occurs in a field-effect transistor. As this occurs, hole pairs for an n-channel embodiment (resulting generally from impact ionization) drift towards the gate 150, under the influence of the bias applied to this gate. These hole pairs remain in the storage 200 of the body region 120 after the potential is removed from the word line 240 and the potential is removed from the bit line 230. Other charging mechanisms may be used to write data into a cell. For example, gate-induced drain leakage (GIDL) also creates electron/hole pairs at a different set of biases (VFG<0, Vd>0, VBG<0).

Assume that it is necessary to determine whether the cell is storing a binary 1 or binary 0. The cell is selected by the application of a positive potential to the word line 230. The threshold voltage of the cell shifts, depending on whether holes are stored in the region 200. The cell has a lower threshold voltage, that is, it conducts more readily, when there is charge stored in the region 200. This shift in threshold voltage is sensed by the sense amplifier 180 and provides a reading of whether the cell is storing a binary 1 or binary 0. The reading is provided to an I/O output line, or to refresh circuitry to refresh the state of the cell.

The threshold voltage of the cell may be determined by comparing its threshold voltage to that of a reference cell in a cross-coupled sense amplifier. The threshold voltage of a reference cell may be established by, for example, having less charge or less bias on one of the memory cells used as a reference cell.

One characteristic for a dynamic memory cell is its retention time. This is the time between refresh cycles needed to restore the stored charge representing a binary state. Ideally, the retention time should be as long as possible to reduce the overhead associated with refreshing the cells and to provide longer periods during which the cells may be accessed. Ideally, the retention time should be increased without negatively impacting other cell characteristics such as read voltage, cell size, etc. As will be seen below, improved retention time is obtained without an increase to the cell size or its read voltage and with very little added complexity in the fabrication of the cell. This is achieved by asymmetrically doping the channel region such that more dopant is present in the storage region 200 of the cell of FIG. 1 than beneath the gate 160.

Figure 2:
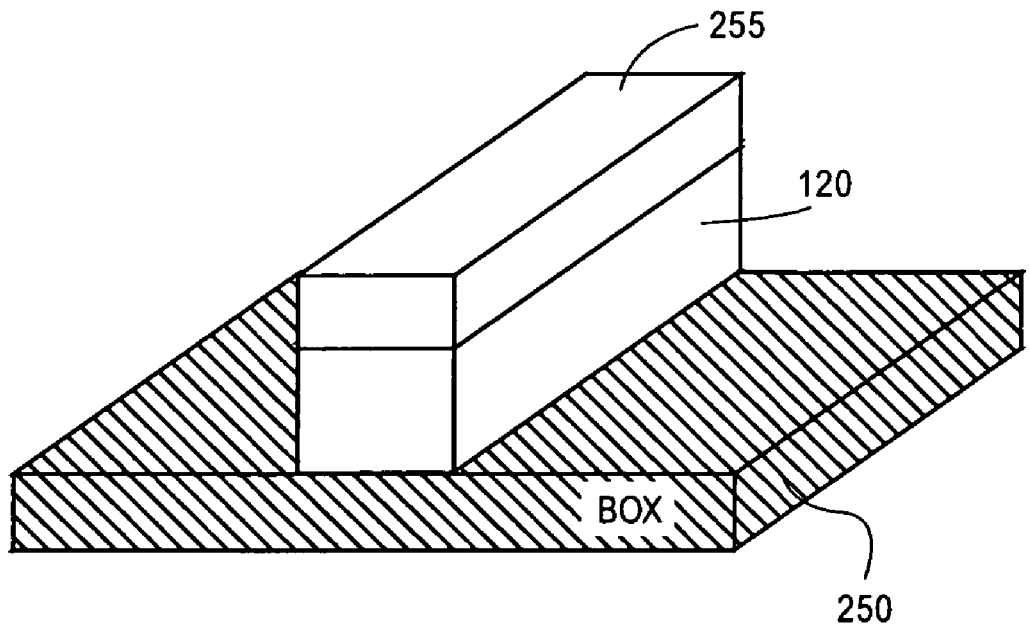
FIG. 2 is a perspective view of a semiconductor body disposed on a buried oxide layer.

In one embodiment, the cell is fabricated on a BOX 250 of FIG. 2; BOX 250 is formed on a silicon substrate not illustrated. Active devices for the memory are fabricated in, for instance, a monocrystalline silicon layer, disposed on the BOX 250. This SOI substrate is well-known in the semiconductor industry. By way of example, it is fabricated by bonding a silicon layer onto a substrate, and then, planarizing the silicon layer so that it is relatively thin. This relatively thin, low body effect layer, is used for active devices. Other techniques are known for forming the SOI substrate including, for instance, the implantation of oxygen into a silicon substrate to form a buried oxide layer.

Figure 7:
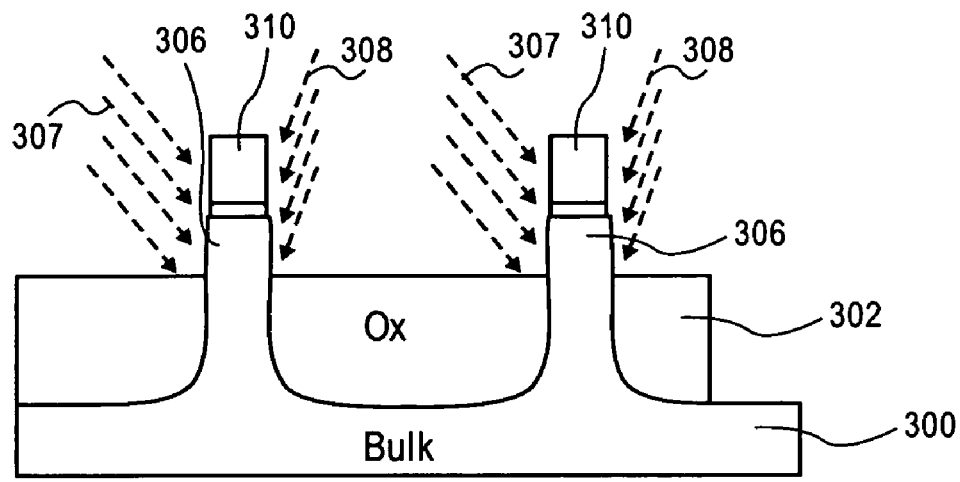
FIG. 7 is a cross-sectional, elevation view of two adjacent bodies formed on a bulk substrate.

The described processing below focuses on the fabrication of the cells in a memory array. While the array is fabricated on one section of an integrated circuit, the peripheral circuits for the memory may be fabricated on other sections. Moreover, while the description below is directed to the fabrication of the cell on an SOI substrate, other substrates may be used such as bulk monocrystalline substrate as shown in FIG. 7.

In the processing for one embodiment, first a protective oxide is disposed on the silicon layer of the SOI substrate followed by the deposition of a silicon nitride layer. The silicon nitride is masked to define a plurality of spaced-apart, elongated, parallel lines and the underlying silicon layer is etched in alignment with these lines. The resultant structure for one body (also sometimes referred to as a line or fin) is shown FIG. 2, specifically body 120 disposed on the BOX 250 with the overlying masking member 255.

Figure 3:
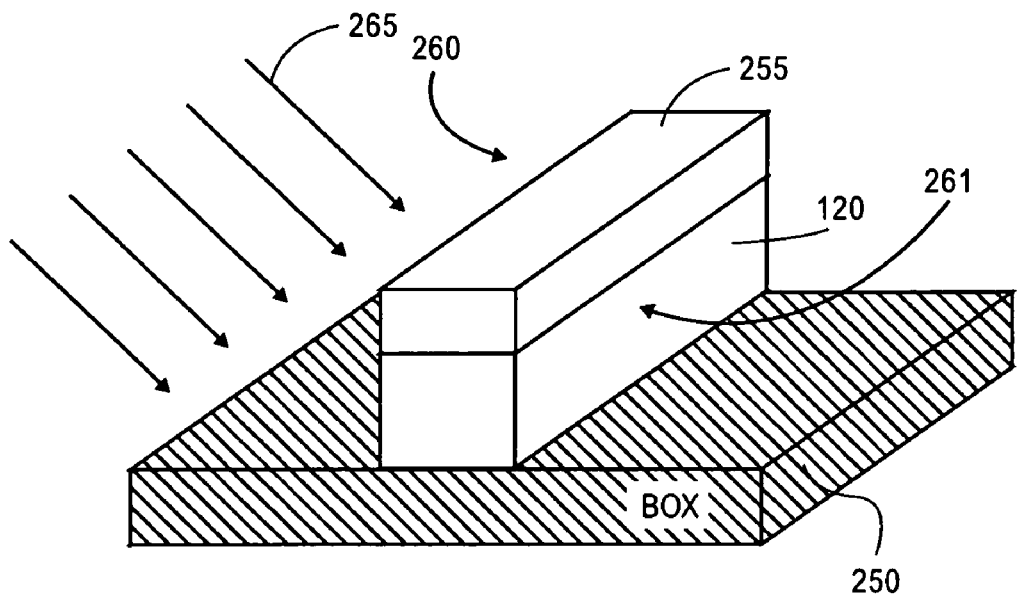
FIG. 3 illustrates the structure of FIG. 2 during an ion implantation process directed at one side of the body.

As can be seen in FIG. 3, the body 120 has two sides with opposite facing surfaces 260 and 261 which are parallel to one another. A first ion implantation step is used to implant ions into the body beneath the surface 260. Ion implantation is shown by the beam 265 of FIG. 3 directed into the surface 260 of the body 120. Note that this implantation does not contact the surface 261 of the body. As is known in the art, the angle at which the ion implantation occurs is selected based on several criteria including the depth at which the impurities are to be implanted, the height and width of the body 120, and the energy level used. The implantation of FIG. 3 is used to generally implant the region 270 shown in the cross-section of FIG. 5 and not the region 271. For an n channel device, a p type dopant such as boron is used for this implantation. By way of example, the implanted region 270 (beneath the back gate) is implanted to a level of $2E^{18}$ atoms/cm$^3$.

Figure 4:
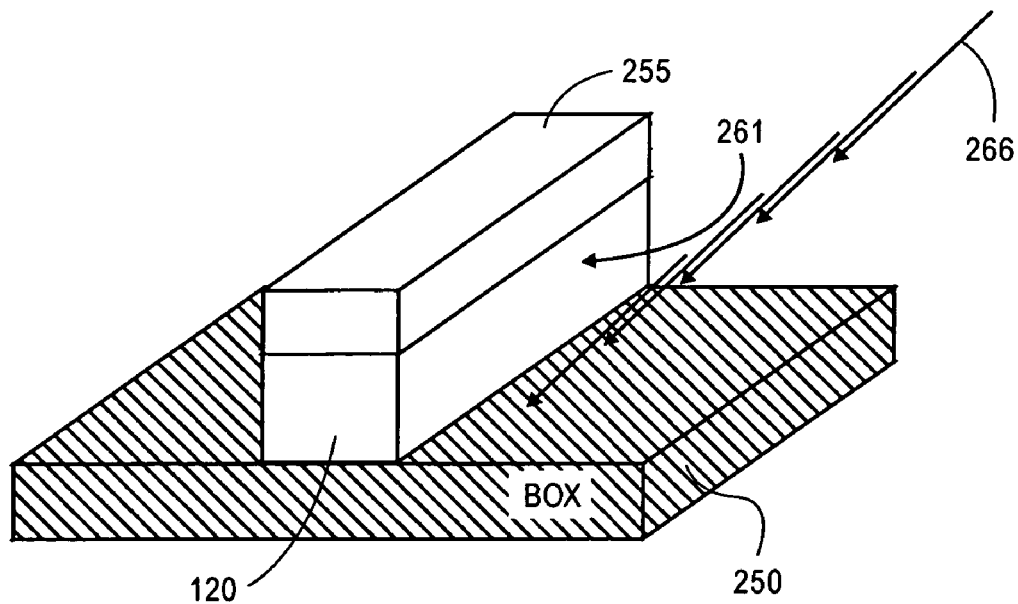
FIG. 4 illustrates the structure of FIG. 3 during a second ion implantation process directed at an opposite side of the body to that shown in FIG. 3.
Figure 5:
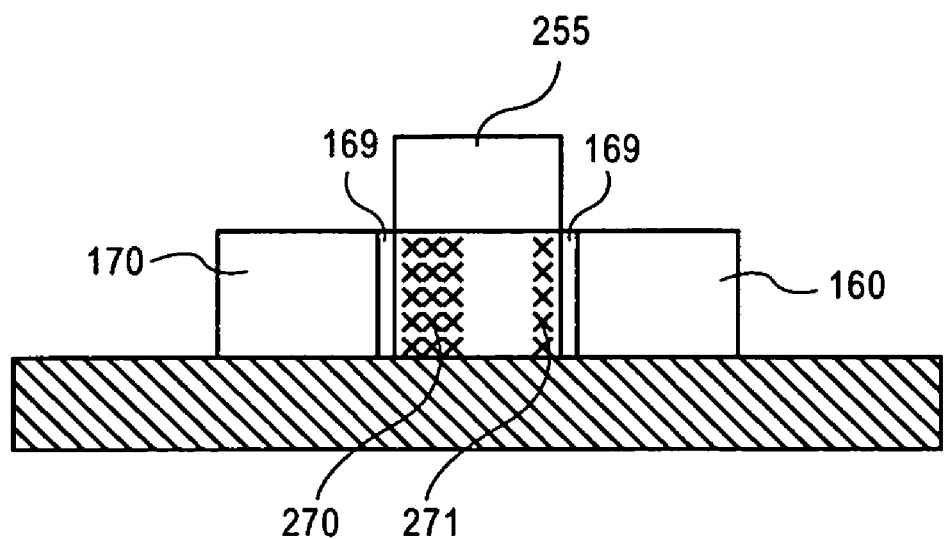
FIG. 5 is a cross-sectional, elevation view of the body of FIG. 4 used to illustrate the doping that has occurred in the body from the steps of FIGS. 3 and 4.

In a second ion implantation illustrated in FIG. 4, impurities of the same conductivity type as used for the implantation of FIG. 3, are implanted into the surface 261 of the body 120. This is shown by the beams 266 of FIG. 4. The resultant implantation of the ions are shown in FIG. 5 in the region 271. This p type dopant for the n channel embodiment, is in a region beneath the front gate (gate 160). Again, an appropriate angle and energy level are selected, as known in the art, to implant the region 271. The dopant levels in the region 270 and the region 271 are different as illustrated by the "Xs" in FIG. 5. The region beneath the back gate (region 270) is doped to a level of, an order of magnitude or greater, than the dopant level beneath the front gate (region 271) in one embodiment. The difference in doping level will vary based on, for instance, whether the substrate is an SOI substrate or a bulk substrate.

Only the channel region of the cell needs to be implanted to provide the improved retention provided by the asymmetrical doping. For the process shown in FIGS. 3 and 4, the entire body is asymmetrically implanted with a p type dopant, and after the formation of the gate structure, the source and drain regions are implanted with an n type dopant to form the source and drain regions. Alternatively, particularly in a replacement gate process, the channel region, alone, of the device can be asymmetrically implanted when the channel region of the body is exposed after the removal of the sacrificial gate structure. In this manner, the source and drain regions are not doped with the p type dopant, for the n channel embodiment under discussion.

While in FIGS. 3 and 4, two separate ion implantation steps are illustrated to obtain the asymmetrical doping, other processes may be used to obtain this asymmetrical doping. For instance, the layer from which the body 120 is formed may be doped to a first level, the level needed beneath the front gate. Then, after the body is formed, only a single implantation process is needed (the step shown in FIG. 3) to implant ions in the region 270 of the body beneath the back gate. Still alternatively, it may be possible in some processes to implant the region beneath the front gate at a high energy level from the side of the body opposite the front gate. Then the more highly doped region under the back gate may be implanted at a lower energy level from the same side of the body. For this process, implantation occurs as shown in FIG. 3 at two different energy levels. Other processing yielding asymmetrical doping beneath the front gate and the back gate will be apparent to one skilled in the art.

One advantage to implanting from both sides of the body, as illustrated in FIGS. 3 and 4, is that the profile of the dopant gradient across the channel, that is, between the front gate and back gate, can be better controlled. In some cases, it may be desirable to have a lower doping level in the central region of the body than is under either the front gate or back gate.

In FIG. 5 the cell is shown after the formation of the front and back gates which are insulated from the sides of the body by the dielectric layer 169. The dielectric layer may be a grown oxide, a high k dielectric such as $HfO_2$, or other dielectrics. The gates 160 and 170 may be fabricated from polysilicon or metal with a targeted work function. A combination of metal and polysilicon may also be used. The gate dielectric

169 and gates 160 and 170 may be fabricated as described in one of the application cited in the Prior Art and Related Art section of this application.

Figure 6:
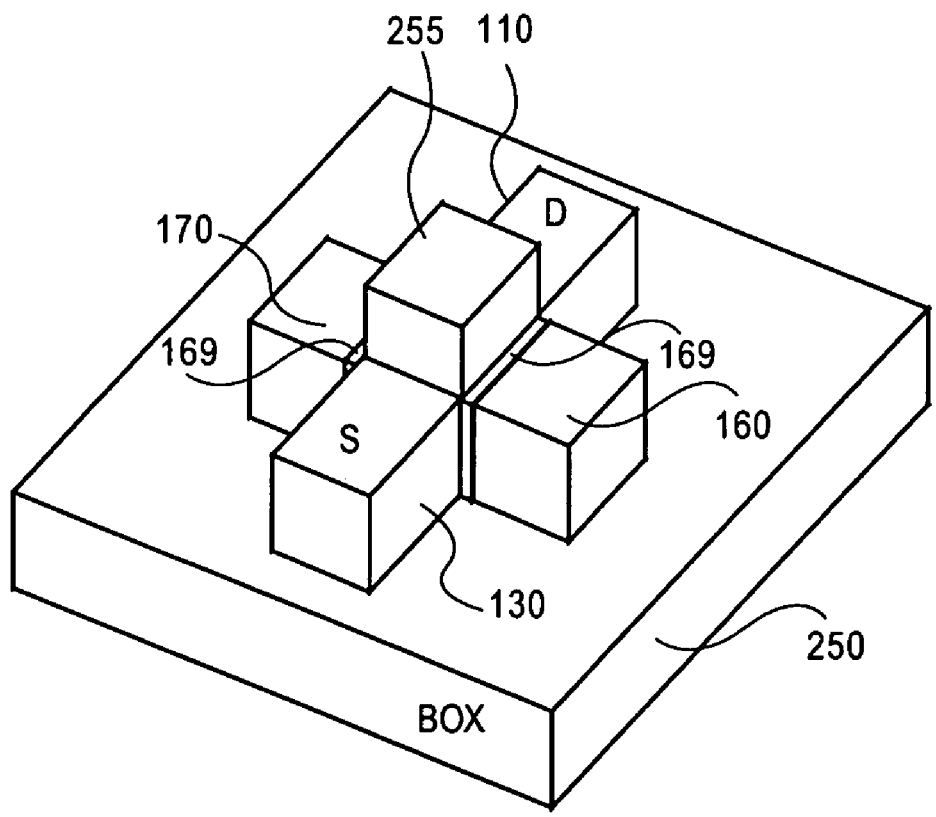
FIG. 6 is a perspective view of the body showing the source and drain region of the cell.

In FIG. 6 the cell of FIG. 5 is shown in perspective view with a source region 130 and a drain region 110. The asymmetrically doped channel regions are disposed in the body between the gates 160 and 170 and between the source and drain regions. While not shown, typically spacers are formed after tip source and drain regions are implanted and before the main source and drain regions are doped. Contacts and interconnect layers used to complete a memory are not shown.

In the cross-sectional view of FIG. 7, a bulk monocrystalline substrate such as a silicon substrate 300 is illustrated. Two bodies 306 are fabricated from the bulk silicon between the oxide isolation regions 302. These bodies are capped with silicon nitride members 310 which have an underlying oxide disposed between members 310 and the bodies 306. The bodies 306 may be fabricated by etching the bulk silicon as is known in the art or by epitaxial growth from the bulk silicon. For purposes of this application these bodies are considered "floating" bodies.

In FIG. 7, two separate ion implantation steps are shown. The ion implantation beam 307 is used to illustrate the implantation of the ions of a first conductivity type beneath a first surface of the bodies 306 corresponding to the region beneath a back gate. The second ion implantation shown by the beam 308, implants the region beneath a front gate and is more lightly doped than the region beneath the back gate. Again, different ion implantation steps may be used to obtain the asymmetric doping beneath the opposite surfaces of the bodies, as described above for the SOI substrate. Also as described above, source and drain regions are fabricated as well as gate dielectrics and gates.

Figure 8:
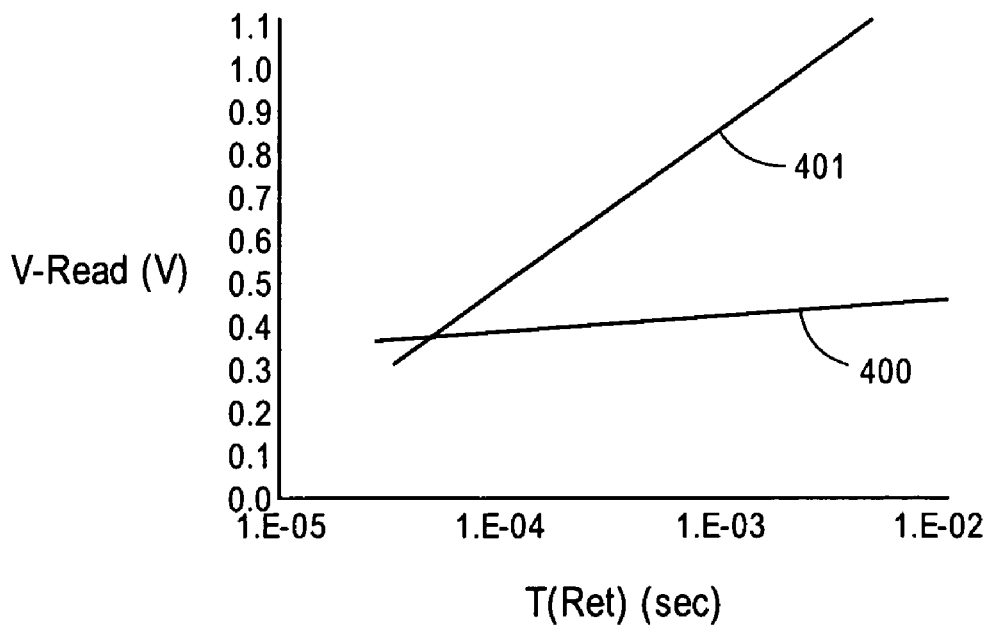
FIG. 8 is a graph illustrating the improvement obtained by the asymmetric doping in the body in terms of retention time and read voltage.

The improvement in performance obtained by using the asymmetric doping is illustrated in FIG. 8. The abscissa of the graph of FIG. 8 represents the retention time in seconds. The ordinate shows the read voltage in volts. The line 400 represents the characteristics of the cell with asymmetrical doping. The line 401 represents the characteristics of the cell without the asymmetric doping. In both cases, other parameters of the cell were changed. As can be seen for the line 401, increased retention time was obtainable without asymmetric doping, however, at the cost of increased read voltage. In contrast, with the asymmetric doping, as illustrated by line 400, increased retention time was achievable with very little increase in the read voltage.

In the above discussion the operation and fabrication of an n channel cell is described. The cell could alternatively be a p channel device with p-type source and drain regions, and with asymmetrical n-type doping in the channel region.

Thus, an improved floating body cell has been described which uses asymmetric doping beneath the back gate and front gate to obtain improved performance, particularly improved retention time.

What is claimed is:

1. A semiconductor device comprising:
    a semiconductor body having opposite first and second surfaces defining a channel region, the channel region having a first region comprising a first conductivity type dopant, the first region beneath the first surface, a second region of the first conductivity type dopant, the second region beneath the second surface, and a third region between the first and second regions, wherein the dopant level of the first region is higher than the dopant level of the second region, and wherein the dopant level of the second region is higher than the dopant level of the third region;
    a first and second gate each disposed over the first and second surfaces, respectively, and insulated from the surfaces; and
    a source and drain region formed in the body with the channel region disposed therebetween.

2. The device of claim 1, wherein said first gate is coupled to a fixed potential in a memory.

3. The device of claim 2, wherein the second gate is coupled to a word line in a memory.

4. The device of claim 3, wherein said first conductivity type dopant is a p type dopant and the source and drain regions comprise n type dopants.

5. The device of claim 1, wherein the dopant level of the first region is at least approximately an order of magnitude higher than the dopant level of the second region.

6. The device of claim 1, wherein the first and second gates comprise metal.

7. The device of claim 1, wherein the body is disposed on a silicon-on-insulated (SOI) body.

8. The device of claim 1, wherein the body is formed on a bulk silicon substrate.

9. A semiconductor memory device comprising:
    a silicon body having a source and drain region spaced apart in the body;
    a first gate and a second gate insulated from the body each generally disposed on an opposite, parallel side of the body between the source and drain regions;
    a first region under the first gate, the first region doped with a first conductivity type dopant to a first dopant level;
    a second region under the second gate, the second region doped with the first conductivity type dopant to a second level, the first level being higher than the second level; and
    a third region between the first and second regions, the third region having a dopant level lower than the second level.

10. The memory device of claim 9, wherein the first dopant level is at least an order of magnitude higher than the second dopant level.

11. The memory device of claim 10, wherein the second gate is coupled to a word line.

12. The memory device of claim 11, wherein the source and drain regions are coupled to a sense amplifier.

13. The memory device of claim 12, wherein the first gate is coupled to a fixed potential.

14. The memory device of claim 13, wherein the first conductivity type dopant is p type, and the source and drain regions comprise n type dopants.

15. The memory device of claim 14, wherein the gates are insulated from the body with a dielectric comprising $HfO_2$, and the gates comprise metal.

16. The memory device of claim 15, wherein the body is disposed on a silicon-on-insulator substrate.

17. The memory device of claim 15, wherein the body is formed on a bulk silicon substrate.

* * * * *

UNITED STATES PATENT AND TRADEMARK OFFICE
CERTIFICATE OF CORRECTION

PATENT NO. : 7,646,071 B2
APPLICATION NO. : 11/444941
DATED : January 12, 2010
INVENTOR(S) : Ban et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 317 days.

Signed and Sealed this

Twenty-eighth Day of December, 2010

David J. Kappos
*Director of the United States Patent and Trademark Office*